United States Patent [19]
Chen et al.

[11] Patent Number: 5,196,400
[45] Date of Patent: Mar. 23, 1993

[54] HIGH TEMPERATURE SUPERCONDUCTOR DEPOSITION BY SPUTTERING

[75] Inventors: Chiou T. Chen; Dennis L. Krause, both of Atkinson, N.H.

[73] Assignee: AT&T Bell Laboratories, Murray Hill, N.J.

[21] Appl. No.: 569,047

[22] Filed: Aug. 17, 1990

[51] Int. Cl.$^5$ .................. C23C 14/34; H01L 39/24
[52] U.S. Cl. .................. 505/1; 204/192.15; 204/192.24; 427/34; 427/423; 505/731
[58] Field of Search .................. 505/1, 730, 731, 732, 505/816; 427/34, 423; 204/192.15, 192.24, 298.12, 298.02

[56] References Cited

U.S. PATENT DOCUMENTS

| | | | |
|---|---|---|---|
| 3,669,871 | 6/1972 | Elmgren et al. | 204/298.12 |
| 4,491,509 | 1/1985 | Krause | 204/192.12 |
| 4,834,856 | 5/1989 | Wehner | 204/298.12 |
| 4,842,704 | 6/1989 | Collins et al. | 204/192.24 |
| 4,902,671 | 2/1990 | Koinuma et al. | 204/192.24 X |
| 4,929,595 | 5/1990 | Wu | 204/192.24 X |
| 4,968,665 | 11/1990 | Ohuchi et al. | 204/192.24 X |
| 5,002,648 | 3/1991 | Morach et al. | 204/192.15 |

FOREIGN PATENT DOCUMENTS

| | | | |
|---|---|---|---|
| 0239807 | 10/1986 | Fed. Rep. of Germany | 204/298.12 |
| 0104081 | 5/1986 | Japan | 204/298.12 |

OTHER PUBLICATIONS

"Hoehler and Neeb, Preparation of Thin $TBa_2Cu_3O_7$ Layers ... by d.c. Magnetron Sputtering", *Journal of the Less Common Metals 151 (1989)* pp. 341-344.
Perkin-Elmer Metco Division, Advertising Brochure, *Plasma Spray Technology for Superconductor Research,* 1988, p. 2, col. 3.

Primary Examiner—Nam X. Nguyen
Attorney, Agent, or Firm—Gordon E. Nelson

[57] ABSTRACT

A target which is a good conductor of heat and electricity is plasma sprayed with a weakly conducting material such as a metallic oxide. The target is then employed in a magnetron sputtering apparatus to sputter the material sprayed onto the target onto a substrate. The technique permits use of power densities and target sizes and shapes which are advantageous for sputtering substrates having large surface areas.

10 Claims, 2 Drawing Sheets

HIGH TEMPERATURE SUPERCONDUCTOR DEPOSITION BY SPUTTERING

BACKGROUND OF THE INVENTION

1. Field of the Invention

The invention relates generally to the deposition of a film on a substrate and more specifically to the use of sputtering to deposit films of weakly-conducting materials such as carbon or metallic oxides on substrates.

2. Description of the Prior Art

Sputtering is a much-used technique for depositing films on substrates. In sputtering, a source of material for the film called a target is placed in a vacuum chamber along with the substrates and the chamber is evacuated. After evacuation, the target is bombarded with ions. The ions knock material off the target, and the substrates are positioned in such fashion that the material which has been knocked off the target is deposited on the substrates. The most common source of ions is a plasma. To produce the plasma, the vacuum chamber is backfilled with an inert gas and a DC potential is applied between the target, which serves as a cathode, and an anode. The plasma forms in front of the target, and ions from the plasma bombard the target with the results just described. A common kind of sputtering apparatus is the magnetron. In the magnetron, a magnetic field is used to confine and enhance the plasma. The use of the magnetic field results in an increase in the number of ions generated for a given potential, and consequently a reduction in the potential required to create and maintain the plasma.

Sputtering apparatus which employs a plasma as an ion source is most effective when the target is made of material which conducts both heat and electricity well. Conduction of heat is important because the ion bombardment heats the target; if the target gets too hot, physical damage or changes in the composition of the target material may result. Conduction of electricity is important to prevent accumulation of surface charge on the target. The surface charge has the same polarity as the bombarding ions and therefore tends to repel the ions. If the target does not conduct electricity, radio frequency oscillations must be applied to the plasma, adding to the complexity of the sputtering apparatus and the sputtering process. Details concerning all of the above may be found in Rointain F. Bunshah et al., *Deposition Technologies for Films and Coatings*, Noyes Publications, Park Ridge, N.J., 1982, pp. 170–243.

The limitations of plasma sputtering with regard to materials which do not conduct heat or electricity well have become more important with the discovery of high temperature superconducting metallic oxide compounds. At ordinary temperatures, these compounds are weak conductors of heat and electricity like other metallic oxides, but when cooled to temperatures in the neighborhood of the boiling point of nitrogen (77 degrees K.), fine wires or thin films of the compounds become superconductors of electricity.

The usefulness of high-temperature superconductors in electronic devices depends on the development of inexpensive techniques for depositing them in thin films on substrates. The use of magnetron sputtering to produce such thin films has been made difficult by the weak electrical and heat conductivity of the high-temperature metallic oxide superconductors. These problems are exacerbated by the fact that bulk amounts of high temperature superconductors are made from a powder of the superconducting compound by compacting the powder into the desired shape and then sintering it so that the particles of the powder adhere to each other. The mechanical properties of the sintered powder are poor and the sintered powder is an even worse conductor of heat and electricity than thin films or wires of the superconducting compound. In consequence, the prior art has not been able to use large targets or high potentials to sputter superconducting compounds and has thus been able to sputter superconducting compounds on only a small scale. One example of such small-scale sputtering using a magnetron is found in Hoehler and Neeb, "Preparation of Thin $YBa_2CUsub3O_{7-8}$ Layers on Various Substrates . . . by d.c. Magnetron Sputtering", *Journal of the Less-common Metals*, 151 (1989) pp. 341–344.

What is needed if films of high-temperature superconducting materials are to be produced at low cost and high volume is a technique for magnetron sputtering of such materials which overcomes the problems caused by the poor conductivity of heat and electricity which is characteristic of the compounds and the exacerbation of these problems which result from the use of sintered targets. Such a technique is provided by the present invention.

SUMMARY OF THE INVENTION

The technique of the invention may be used in a magnetron sputtering device to sputter any material which can be plasma sprayed onto a target onto a substrate. The technique is particularly useful with materials which are weak conductors of heat or electricity. Such materials include not only the high-temperature superconducting materials described above, but also metallic oxides generally and carbon. In method terms, the technique of the invention may be summarized as follows:

employing a material with high heat and electrical conductivity for the target of the sputtering device;

applying a coating of the material to be sputtered to a surface of the target which is subject to ion bombardment, the coating having the property that particles of the material to be sputtered are tightly bonded to each other and/or to the surface; and operating the sputtering device using the target.

Other aspects of the technique include cooling the target during the sputtering operation, the use of a magnetic field to control deposition of the material to be sputtered on the substrate, the lack of any requirement for radio frequency enhancement, the use of spray techniques such as plasma spraying to coat the surface, the lack of any limitation other than those imposed by the magnetron on the size and shape of the target, and the use of a cylindrical target. The technique may be applied to any superconductor and may be applied specifically to superconducting materials of the class YBaCuO. Other objects and advantages of the invention will be apparent to those of ordinary skill in the art upon consideration of the following Drawing and Detailed Description, wherein:

DETAILED DESCRIPTION

Figure 1:
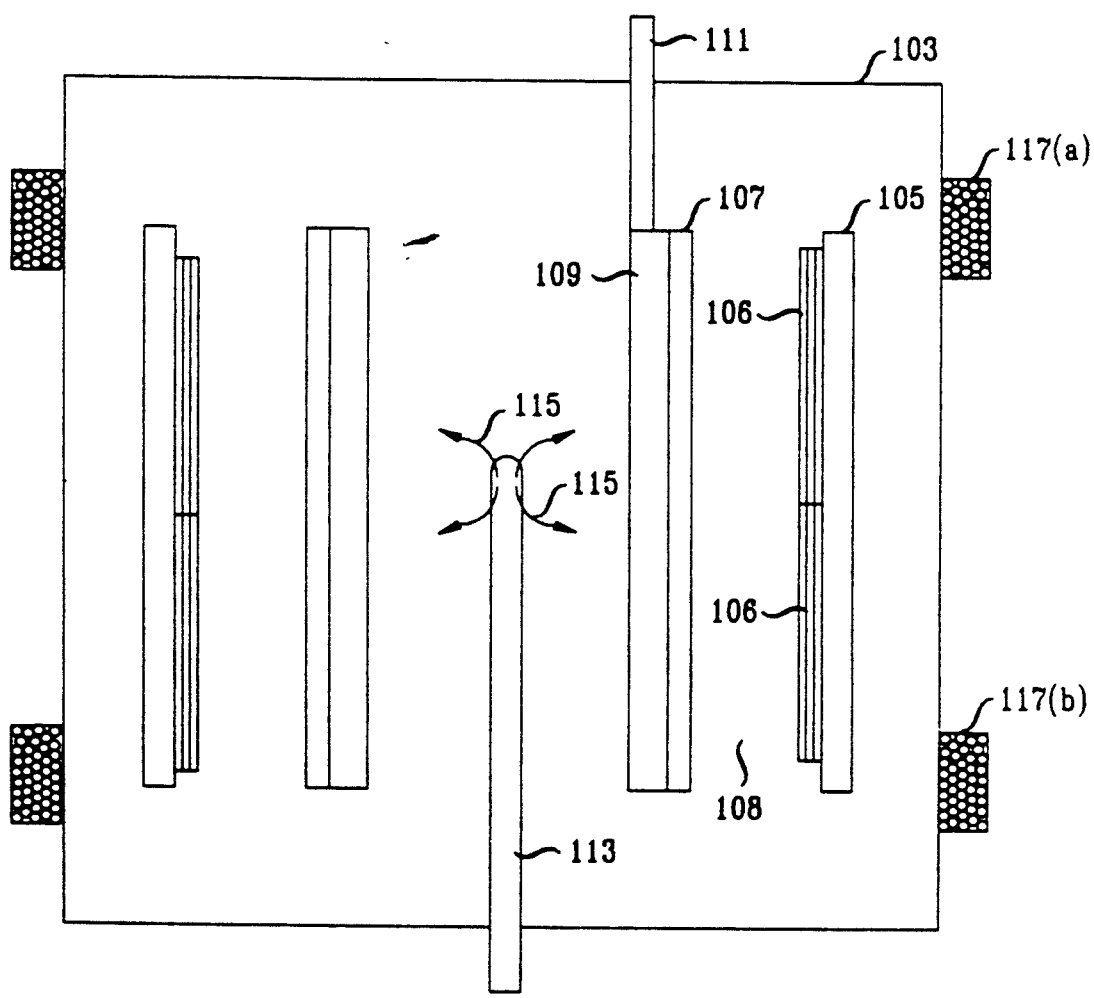
FIG. 1 is a schematic diagram of a magnetron sputtering device in which the technique of the invention is employed.

A magnetron sputtering device of a type in which the invention may be practiced is disclosed in detail in U.S. Pat. No. 4,491,509, Dennis L. Krause, *Methods of and Apparatus for Sputtering Material onto a Substrate*, issued Jan. 1, 1985. That patent is hereby incorporated into the present disclosure by reference. FIG. 1 is a schematic drawing of a cross section of a magnetron sputtering device of the type disclosed in detail in U.S. Pat. No. 4,491,509. The schematic shown only those portions of the magnetron sputtering device which are pertinent to the present invention. Magnetron sputtering device 101 includes cylindrical vacuum chamber 103, whose side walls are made of nonmagnetic material. Two coils 117(a) and 117(b) surround vacuum chamber 103. The coils 117 serve to generate magnetic fields inside vacuum chamber 103. Within vacuum chamber 103, there is a cylindrical fixture 105 which carries substrates 106 (two high in a preferred embodiment) onto which a sputtered film is to be deposited. Concentric to the cylinder of substrates is a cylindrical target 107, and tightly mated to target 107 is cooling cell 109, which is cooled by means of water introduced through tube 111. At the axis of the cylindrical vacuum chamber is gas tube 113, which is used to introduce doping gases 115 into vacuum chamber 103.

In operation, vacuum chamber 103 is evacuated and a cylindrical magazine containing substrates 106 is loaded through an airlock into chamber 103. Sufficient argon gas to produce a plasma is then introduced into vacuum chamber 103, a negative potential is applied to target 107, and the outer wall of vacuum chamber 103 and fixture 105 are grounded. At the same time, current flows through coils 117, creating a magnetic field which confines charged particles to space 108. As a result, a plasma forms in space 108 between cylindrical target 107 and substrates 106. Bombardment of cylindrical target 107 by argon ions in the plasma knocks material off the surface of target 107, and the majority of the material which is knocked off is deposited on substrate 106. The magazine containing substrates 106 is rotated about the axis of cylindrical target 107, ensuring even application of the sputtered material to substrate 106. While the material is being deposited on the substrate, it can be modified by introducing doping gases through pipe 113. Control of the depositing process is maintained by varying the potential on target 107, the magnetic fields generated by coils 117, the mixture and the pressure of the gases in chamber 103, and the length of time substrates 106 remain in chamber 103.

Figure 2:
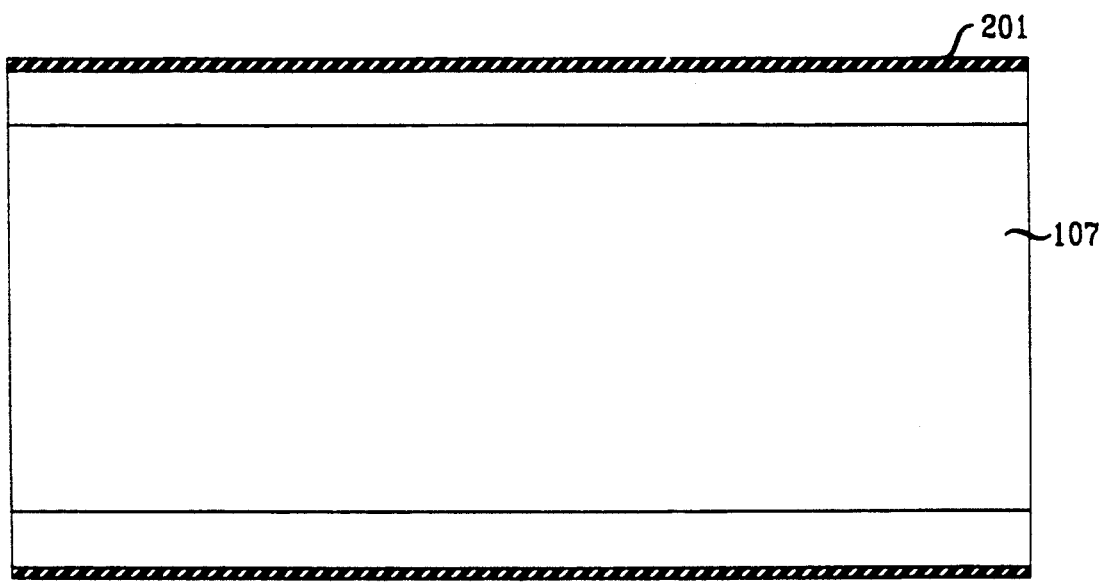
FIG. 2 is a cross section of a target for the magnetron of FIG. 1

As shown in FIG. 2, when the technique of the present invention is practiced in the magnetron sputtering apparatus of FIG. 1, a coating 201 of the material to be sputtered, in this case, a superconductor of the class Y-Ba-CuO, is applied to the outer surface of target cylinder 107, shown in FIG. 2 in cross section. The coating may be applied by any method which ensures a good bond between the surface of target 107 and the coating and between the particles of the coating. In the preferred embodiment, target 107 is made of copper. However, other materials which are good conductors of heat and electricity may be employed.

In a preferred embodiment, the coating is applied by plasma spraying a powder of Y-Ba-CuO onto the outer surface of target cylinder 107. Plasma spraying is a well-known technique in which a plasma coating torch is used to apply a powdered material to a surface. The plasma torch is a nozzle which is connected to a high-pressure source of a gas such as argon. Within the nozzle, a cathode and anode are located on opposite sides of the stream of gas flowing through the nozzle. A direct current arc is maintained between the cathode and anode, and the arc produces a plasma of the gas. The powdered material is injected into the plasma, which heats and accelerates the particles of the powder sufficiently that they flow into thin lenticular shapes when they hit the surface being coated. The plasma spraying process thus ensures a good bond between the surface and the material making up the powder and between the powder particles themselves. Plasma spraying may be used to produce coatings ranging in thickness from 0.002 inches to 0.2 inches. In the preferred embodiment, a coating of 0.020 inches was applied. Plasma spraying is described in detail at pages 454–489 of the Bunshah reference cited above. Of course, other techniques which ensure a good bond may be employed to coat the target. One such technique is detonation gun spraying, described at the same place in the Bunshah reference.

In the preferred embodiment, a copper target coated as just described was placed in the magnetron sputtering device disclosed in U.S. Pat. No. 4,491,509. Films of $Y_1Ba_2Cu_3O_7$ 4 to 5,000 angstroms thick were deposited in 45 minutes on thirty substrates having dimensions of $4.5 \times 3.75$ inches, for a total substrate collecting surface of 506 sq. inches. The following parameters were used to deposit these films.

| | |
|---|---|
| cathode current | 10 A |
| cathode voltage | 310 V |
| power density | 0.8 watts/sq.cm |
| magnetic coil current | 5.15 A |
| magnetic coil voltage | 20 V |
| effective magnetic field | 30 gauss |
| chamber pressure | 10 microns |
| argon flow | 100 sccm |
| machine cycle time | 180 sec |

Advantageous consequences of applying coating 201 to target 107 include the following:
- The material making up coating 201 may be sputtered in magnetrons having targets of any shape or size;
- The tight bond between coating 201 and target 107 permits each transfer of heat from coating 201 to target 107, which in turn may be cooled as shown in FIG. 1;
- The tight bond permits sufficient flow of current from coating 201 to target 107 to prevent charge accumulation on coating 201; this in turn makes radio frequency enhancement unnecessary; and
- The atoms sputtered from coating 201 have a positive charge, and thus deposition patterns may be controlled using magnetic fields generated by coils 117.

As a consequence of these advantages, the material making up coating 201 may be uniformly deposited onto substrates with large surface areas. The technique thus overcomes important barriers to the large-scale use of magnetron sputtering to produce thin films of superconductors such as Y-Ba-CuO and similar materials.

CONCLUSION

The foregoing Detailed Description has showed how one of ordinary skill in the art may deposit a thin film of a superconducting compound onto a substrate by plasma coating a surface of a target with the superconducting compound and subjecting the surface to ion bombardment in a magnetron sputtering device. The technique described herein is however not limited to the cylindrical magnetron sputtering device described herein, but may be applied in any such device, including planar devices. Further, any coating technique may be used which produces a sufficiently tight bond between the compound being sputtered and the target and any available technique may be used for cooling the target. Finally, the technique may be applied with any material whose electrical and heat conductivity are similar to those of the superconductors which are sputtered in the preferred embodiment. For all of these reasons, the foregoing Detailed Description is to be understood as being in all respects illustrative and exemplary, but not restrictive, and the scope of the invention is to be determined not from the Detailed Description, but rather from the appended claims as read in light of the Detailed Description and interpreted according to the doctrine of equivalents.

We claim:

1. A method of employing a direct-current magnetron sputtering device to sputter a first material which has low heat and electrical conductivity at the temperatures encountered in the sputtering operation from a target to a substrate, the method comprising the steps of:
   employing a second material with high heat and electrical conductivity for the target;
   applying a coating of the first material to a surface of the target which is subject to ion bombardment in the sputtering device, the coating being applied by spraying a powder of the first material onto the surface and having the property that particles of the first material are tightly bound to each other and/or to the surface; and
   operating the sputtering device using the target.

2. The method set forth in claim 1 wherein:
   the step of operating the sputtering device using the target includes the step of cooling the target during operation.

3. The method set forth in claim 1 wherein:
   the sputtered first material is electrically charged; and
   the step of operating the sputtering device using the target includes the step of magnetically controlling deposition of the sputtered first material on the substrate.

4. The method set forth in claim 1, 2, or 3 wherein:
   the step of operating the sputtering device using the target is performed without radio-frequency enhancement.

5. The method set forth in claim 1, 2, or 3 wherein:
   the first material is a superconducting material.

6. The method set forth in claim 5 wherein:
   the first material is a superconducting material of the class YBaCuO.

7. The method set forth in claim 1, 2, or 3 wherein:
   the step of coating the surface is performed by spraying the particles of the first material onto the surface under temperature and velocity conditions such that the particles flow into thin lenticular shapes when they strike the target.

8. The method set forth in claim 7 wherein:
   the step of spraying the particles is performed by plasma spraying the particles.

9. The method set forth in claim 1, 2, or 3 wherein:
   the size and shape of the surface are limited only by the size and shape requirements of the sputtering device.

10. The method set forth in claim 1, 2, or 3 wherein:
    the surface is cylindrical.

* * * * *